United States Patent [19]
Boudou et al.

[11] Patent Number: 4,843,442
[45] Date of Patent: Jun. 27, 1989

[54] METHOD FOR MEMORIZING A DATA BIT IN AN INTEGRATED MOS-TYPE STATIC RANDOM ACCESS MEMORY CELL, A TRANSISTOR FOR PERFORMING THE METHOD, AND AND THE MEMORY SO OBTAINED

[75] Inventors: Alain Boudou, Vert; Brian Doyle, Paris, both of France

[73] Assignee: Bull S.A., Paris, France

[21] Appl. No.: 79,040

[22] Filed: Jul. 29, 1987

[30] Foreign Application Priority Data

Jul. 30, 1986 [FR] France ................................ 8611029

[51] Int. Cl.$^4$ ............................................. H01L 29/78
[52] U.S. Cl. ...................... 357/23.3; 357/57; 357/23.12; 365/182
[58] Field of Search .................... 357/23.3, 23.5, 23.6, 357/23.12, 57; 365/182, 184

[56] References Cited

U.S. PATENT DOCUMENTS

| | | | |
|---|---|---|---|
| 3,733,591 | 5/1973 | Cricchl ................................. | 357/23.5 |
| 3,974,486 | 8/1975 | Curtis et al. ......................... | 365/178 |
| 4,142,111 | 2/1979 | McElroy .............................. | 365/178 |

OTHER PUBLICATIONS

Troutman, R.–"VLSI Limitations From Drain-Induced Barrier Lowering" IEEE Tran. on Elec. Dev. vol. ED-26 No. 4 Apr. 1979, pp. 461-469.
Toyabe, T. et al., "Analytical Models of Threshold Voltage . . ." IEEE Tran. on Elec. Dev. vol. ED-26 No. 4 Apr. 1979 pp. 453-460.
Alain Boudou et al., "Hysteresis I-V Effects in Short--Channel Silicon MOSFET's", IEEE Electron Device Letters, vol. EDL-8, No. 7, Jul. 1987, pp. 300-302.
Brian S. Doyle et al., "Relaxation Effects in NMOS Transistors After Hot-Carrier Stressing", IEEE Electron Device Letters, vol. EDL-8, No. 5, May 1987, pp. 234-236.
John R. Brews, "Geometrical Factors in Avalanche Punchthrough Erase", IEEE Transactions on Electron Devices, vol. ED-24, No. 8, Aug. 1977, pp. 1108-1116.
Masaaki Aoki et al., "Performance and Hot-Carrier Effects of Small CRYO-CMOS Devices", IEEE Transactions On Electron Devices, vol. ED-34, No. 1, Jan. 1987, pp. 8-18.

Primary Examiner—Andrew J. James
Assistant Examiner—Sara W. Crane
Attorney, Agent, or Firm—Kerkam, Stowell, Kondracki & Clarke

[57] ABSTRACT

A method for memorizing a data bit in an integrated static MOS-type RAM, a transistor for performing the method, and a memory produced by the method are described. An MOS transistor with a weakly doped channel has a hysteresis phenomenon with subthreshold conduction. The transistor is advantageously used as a memory element in an integrated static RAM cell.

13 Claims, 4 Drawing Sheets

METHOD FOR MEMORIZING A DATA BIT IN AN INTEGRATED MOS-TYPE STATIC RANDOM ACCESS MEMORY CELL, A TRANSISTOR FOR PERFORMING THE METHOD, AND AND THE MEMORY SO OBTAINED

FIELD OF THE INVENTION

The invention relates to a method for memorizing a data bit in an integrated static random access memory (RAM) cell of a metal oxide semiconductor (MOS) type, to an MOS transistor for performing the method, and to an integrated MOS-type static RAM memory.

BACKGROUND OF THE INVENTION

An integrated memory is a memory formed on a semiconductor chip, also known as an integrated circuit. A memory takes the form of a matrix of cells connected to a matrix of orthogonal wires. Typically, among these wires there is a set of orthogonal wires serving to asdress each cell. A cell is addressed by means of two decoders, which respectively designate two orthogonal wires representing the line and column to which the cell is connected.

The invention relates to random access memories or RAMs. In these memories, data may be written or read at random. Consequently they have not only addressing wires but also a set of orthogonal wires that respectively enable storing a data bit in each of the cells and reading the contents of each cell. These wires are connected to a control logic that is subject to the action of a control signal CS and a read-write signal R/W that by its state dictates the reading or writing of data. The control logic includes an input for the data to be written into the memory and an output for the data read by the memory. All the information contained in a RAM is lost if the supply voltage disappears.

Among random access memories, a distinction is made between dynamic and static memories. The invention relates to static MOS-type memories, in which each cell contains a bistable multivibrator of a MOSFET (metal oxide semiconductor field effect transistors) type. The two states of the multivibrator represent the two values 0 and 1, respectively, of a data bit.

One advantage of static RAMs is the ability of switching rapidly from one state to the other. Nevertheless, static RAMS have a major disadvantage of requiring a large surface area to embody a cell. Until now, the structure of a bistable multivibrator has necessitated two MOS transistors, each being provided with a load resistor, while two addressing transistors must be provided, the conduction of which indicates which cell has been selected. Accordingly, the bulk of each cell cannot be reduced unless the geometrical dimensions of the transistors are reduced and they are assembled carefully.

OBJECT AND SUMMARY OF THE INVENTION

It is therefore a principal object of the invention to enable Very Large Scale Integration (VLSI) of cells in an integrated static random access memory (RAM) by using a limited number of transistors to comprise each cell.

The method according to the invention for memorizing a data bit in an MOS-type static RAM cell is characterized in that it comprises doping the channel of an MOS transistor of the cell in such a way as to produce a hysteresis phenomenon with conduction below the threshold of the MOS transistor, and utilizing a hysteresis cycle for writing and reading the data bit in this transistor.

The MOS transistor according to the invention has a hysteresis phenomenon with subthreshold conduction.

In corollary fashion, an integrated MOS-type static random access memory according to the invention is characterized in that at least one cell includes, as its memorizing element, an MOS transistor having a hysteresis phenomenon with subthreshold conduction.

Further characteristics and advantages of the invention will become apparent from the ensuing description, which is given by way of non-limiting example, taken in conjunction with the accompanying drawings.

DESCRIPTION OF THE PREFERRED EMBODIMENT

Figure 1:
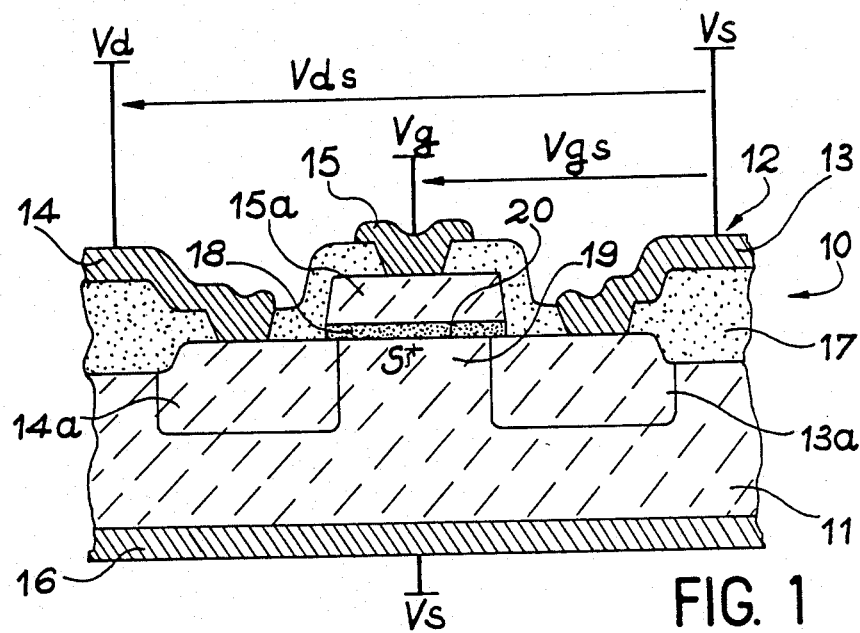
FIG. 1 is a schematic sectional view of a static RAM integrated with an MOS transistor according to the invention.

Referring now to the drawings, and in particular to FIG. 1, there is illustrated a fragmentary view of a static random access memory or RAM 10 that is integrated into a silicon semiconductor substrate 11. The substrate 11 is shown in a transverse elevational section to illustrate an MOS transistor 12 according to the invention. The transistor 12 has the structure of an ordinary MOS transistor, provided with four electrodes, that is, the source 13, drain 14, gate 15 and substrate 16 electrodes, respectively. The substrate 11 incorporates a source region 13a and a drain region 14a of the transistor and has a dielectric layer 17 on substrate 11. The source electrode 13, drain electrode 14 and gate electrode 15 are conductive layers formed above the substrate 11 and crossing the dielectric layer 17 so that they are in contact, respectively, with the source region 13a, the drain region 14a and the gate 15a of the transistor. The gate 15a is located on a thin dielectric oxide gate layer 18, which is disposed on the substrate 11 between the source region 13a and the drain region 14a and forms an interface 20 with the substrate. The thin dielectric layer 18 is typically of silicon dioxide ($SiO_2$). The gate 15a may be of highly doped polycrystalline silicon, or of metal, or of a combination of the two. The channel 19 of the transistor is the region of the substrate 11 located between the source and drain regions 13a, 14a and subjacent the oxide gate layer 18. The substrate electrode 16 as shown covers the back side of the substrate 11. The substrate electrode 16 may also be a region overdoped with the same type of conductivity as the substrate 11 and accessible by a surface electrode located on the outside of the area occupied by the transistor 12. The transistor 12 may be of the n-MOS or p-MOS type. In the usual manner, the transistor 12, as a condition for its function, has its drain electrode 14 connected to a voltage Vd and its gate electrode 15 connected to a voltage Vg, while its source electrode 13 and substrate electrode 16 may be connected to the same voltage, called the source voltage Vs, as shown. The source voltage Vs ordinarily serves as a reference for the drain and gate voltages.

The experimental results indicated in the accompanying graphs were obtained with a transistor 12 having the following characteristics: It belonged to the group known as short channel transistors. Since the length is measured in the direction of the current circulating in the transistors, a transistor of which the geometric gate (shown in the drawing) is shorter than approximately 5 micrometers (5 μm) is called a short transistor. In this case, the geometric length of the gate 15a was 2.5 μm. The oxide gate layer 18 was of the p type and had a resistivity of 18 ohm.cm. The source and drain regions 13a, 14a were of the n type and had a thickness of 400 nm. The substrate was annealed at 1050° C. for 30 minutes and was not provided any threshold implantation, for adjusting the threshold, or punch-through implantation, for counteracting the punchthrough effect. The characteristics of a transistor according to the invention will become apparent once the results of measurement shown in the graphs and described below have been presented and discussed.

Figure 2:
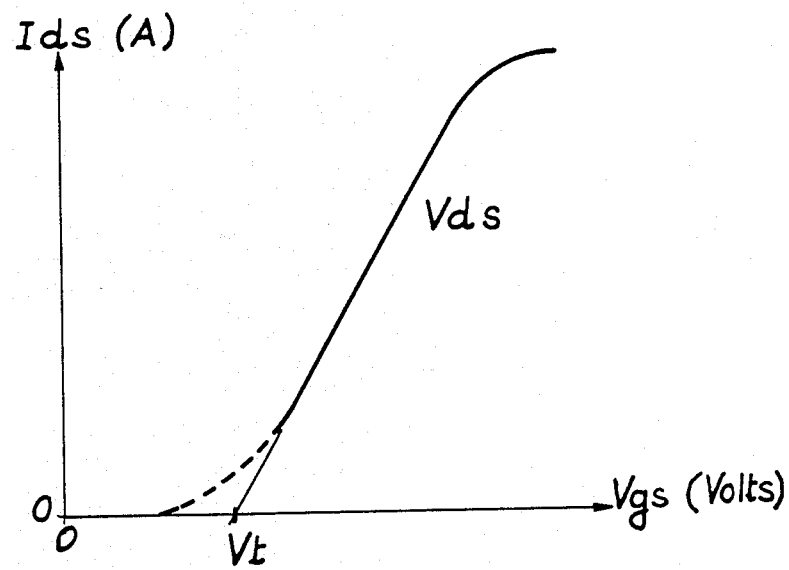
FIG. 2 is a graph with linear scales showing a characteristic curve of the intensity of the drain-source current Ids as a function of the gate-source voltage Vgs for a predetermined parametric value of the drain-source voltage Vds applied to a conventional MOS transistor.

First, the functional characteristics of a conventional MOS transistor will be reviewed. Referring to FIG. 2, there is shown a graph of linear scales, which shows a characteristic curve for the intensity Ids of the drain-source current as a function of the gate-source voltage Vgs applied to a conventional MOS transistor, which is of the n-MOS type like the transistor 12 used for the tests. Ordinarily, the gate voltages Vgs that are applied to a conventional transistor are positive. The characteristic curve shown corresponds to a predetermined parametric value of the drain-source voltage Vds. The characteristic curves corresponding to other parametric values are approximately the same shape as the curve shown. The portion of the curve drawn in solid lines is associated with the normal conduction state of the transistor. This portion is essentially linear and does not curve except at high values of Vgs. The extension of the linear portion, shown by a solid line in FIG. 2, intersects the axis of the voltages Vgs at a point that defines the threshold voltage Vt of the transistor. The linear portion of the normal conduction state verifies the equation Ids = B (Vgs−Vt) Vds, where B is the transconductance coefficient of the transistor. The dot-dash portion of the curve shows the state of conduction below the threshold of the MOS transistor, i.e., of subthreshold conduction. This portion corresponds to the threshold voltage Vt and obeys the approximative equation of short n-MOS transistors: $Ids = Io[(Vgs/a) + (Vds/d)]$, where a and d are predetermined coefficients.

Figure 3:
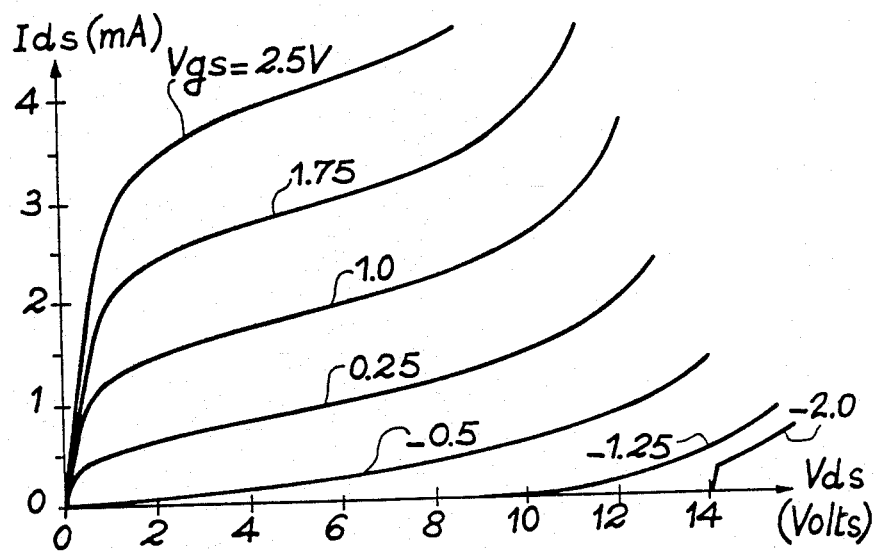
FIG. 3 is a graph showing characteristic curves of the drain-source current Ids as a function of the drain-source voltage Vds applied to an MOS transistor according to the invention.

FIG. 3 is a graph showing characteristic conduction curves for an MOS transistor according to the invention, such as the transistor 12 shown in FIG. 1 and obtained under the above-mentioned experimental conditions. Under these conditions, the theshold voltage Vt is approximately zero volts. The graph shows the variations in the intensity Ids of the current circulating between the drain and the source of the transistor 12 as a function of the voltage Vds between the drain and source electrodes 14, 13 for various parametric values of the gate-source voltage Vgs.

Generally, the curves all begin at the point of origin (Vds=0 and Ids=0). Since Vt=0 volts, the curves that represent normal conduction of the transistor 12 are obtained for positive values of Vgs. Hence they correspond to the portion of the curve drawn in solid lines in FIG. 2, in which the threshold voltage Vt would be zero. The corresponding curves shown in FIG. 3 typically correspond to those of a conventional short channel MOS transistor. They all have a substantially horizontal, slightly rising step (pentode-type curves). For higher values of Vds, the intensity Ids tends to increase along a sharply accentuated slope, which must be limited to prevent destruction of the transistor by the avalanche effect.

The graph of FIG. 3 also shows curves corresponding to subthreshold conduction of the transistor 12, obtained under the aforementioned conditions when the gate voltage Vgs is negative. The curves corresponding to Vgs= −0.5 V and −1.25 V no longer have the step the previously mentioned curves have and so are called triode curves. These well-known curves correspond to conduction below the threshold Vt of a conventional short channel MOS transistor, as represented by the portion of the curve drawn in broken lines in the graph of FIG. 2.

In summary, the set of curves shown, associated with a gate voltage Vgs included between +2.5 V and −1.5 V, are known as typical functional curves of a short transistor in which the doping of the channel has not been optimized. In fact, the resistivity of the channel 19 of the transistor 12 for these conditions is that of the substrate 11, or in other words 18 ohm.cm in the example selected. Under these conditions, the pentode and triode curves shown in FIG. 3 are considered inappropriate for the function normally required for a transistor, because a transistor of this kind is not present in commercially available electronic circuits. Such circuits include transistors in which the channel doping has been optimized by known methods to obtain the typical characteristics curves required. Consequently, the function of such a transistor 12 without optimized channel doping was not studied in particular detail, until now. The invention that will now be described is the product of such a study.

The graph in FIG. 3 illustrates the range of the invention in rudimentary fashion, in the curve corresponding to Vgs= −2.0 volts. It is apparent that in fact this curve has a discontinuity in the high drain voltage range VDS (approximately 14 volts). Generally, the range of the invention is the range in which, in the state of conduction below the threshold of the transistor 12, such discontinuities appear. This range is shown in detail in the graph of FIG. 4. This graph is similar to that of FIG. 3, but it more precisely shows curves corresponding to subthreshold conduction of the transistor 12 in the range of high drain voltages Vds. The curves shown were obtained by slowly increasing the drain voltage Vds from 11 to 16 volts and then slowly returning to 11 volts. For the gate voltage Vgs= −1.05 volts, the curve has no discontinuity at all and corresponds to the normal state of subthreshold conduction of a short channel MOS transistor like that illustrated by the portion of the curve drawn in broken lines in FIG. 2. For Vgs=1.35 V, a sharp bend or step is observed at Vds=12 volts, which indicates an anomaly in the well-known state of subthreshold conduction. For Vgs= −1.65 V, a marked hysteresis effect is observed. When the drain voltage is increased, a discontinuity is produced for Vds=13 V, while when the drain voltage is being decreased the discontinuity does not appear until Vds=12.7 V. The curves show that the hysteresis effect is amplified in proportion to the decrease in the gate voltage. Thus for Vgs= −2.25 V, the two discontinuities are separated by approximately 1.3 V. For lower gate voltages, the hysteresis effect disappears upon outward scanning when the transistor enters the range of source-drain avalanche breakdown.

Figure 4:
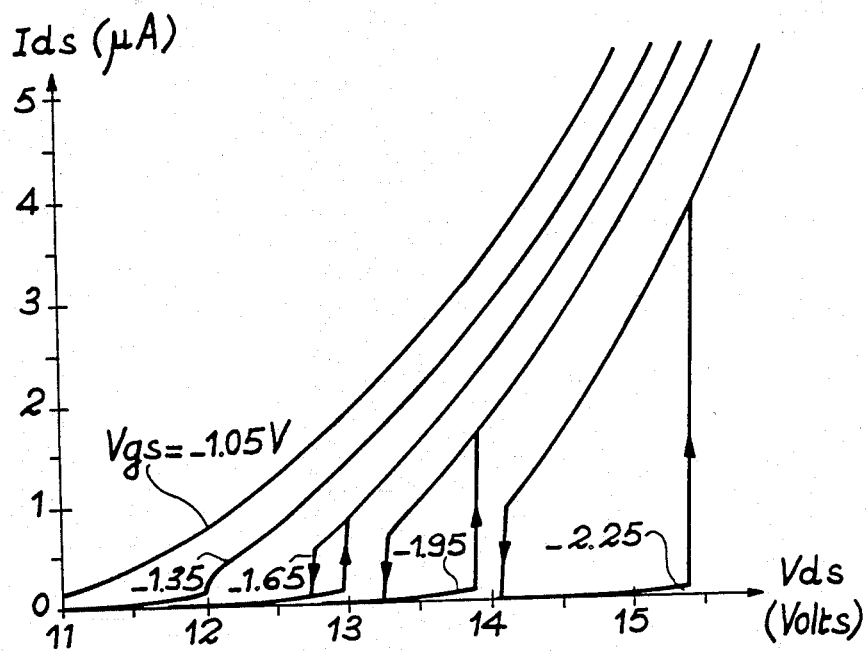
FIG. 4 is a detailed view, on a larger scale, of the graph of FIG. 3, in such a way as to make use of the effect of hysteresis due to conduction below the threshold of an MOS transistor according to the invention.
Figure 5:
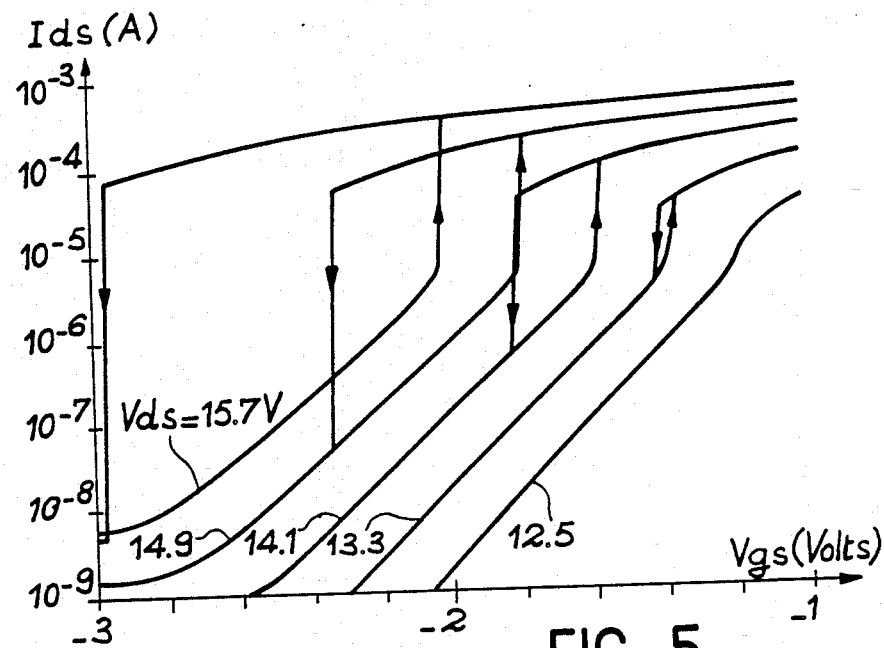
FIG. 5 is a graph on a semilogarithmic scale showing characteristic curves of the drain-source current Ids as a function of the gate-source voltage Vgs applied to a transistor according to the invention with subthreshold conduction.

The graph of FIG. 5 shows curves representing variations in the intensity Ids of the drain-source current as a function of the gate voltage Vgs applied to the transistor 12 for various parametric values of the drain voltage Vds applied to the transistor 12 in the range of the invention corresponding to the graph in FIG. 4. In other words, FIG. 5 is a view on a larger scale of a detail of the graph of FIG. 2, in the range representing subthreshold conduction for an MOS transistor according to the invention. However, the graph in FIG. 5 is semilogarithmic, so as to take major variations in the current Ids (from the nanoampere to the milliampere) into account when the gate voltage Vgs varies on a linear scale from −1 to −3 V. The curve corresponding to the low drain voltages (Vds=12.5 V) has no discontinuity and thus corresponds to the well-known state of subthreshold conduction for a conventional MOS transistor, as shown by the dot-dash portion of the curve in FIG. 2. The exponential variation of the current is logically expressed in the semilogarithmic graph of FIG. 5 by the linear portion of the curve obtained for Vds=12.5 V. A hysteresis effect is observed for Vds=13.3 V. The two discontinuities are quite close to one another, however. The hysteresis effect at Vds=14.1 V is pronounced, and it is amplified when the drain voltage increases. For Vds=15.7 V, the two discontinuities are separated by one volt. It will be observed that the linear portions corresponding to weak currents (at least one microampere, approximately) correspond to the well-known subthreshold conduction, similar to that of the curve associated with Vds=12.5 V. For the higher intensities, the current after changeover varies in accordance with a parabolic law, as FIG. 3 also illustrates. This type of variation corresponds to a state in which current is limited by the space charge.

The hysteresis effect of a transistor according to the invention in subthreshold conduction will now be explained as follows. This explanation will make it possible to define the conditions necessary for obtaining a transistor according to the invention. At high drain voltages Vds, at which the hysteresis effect is produced, an impact ionization near the region of the drain 14a creates electron-hole pairs in this region. The avalanche-created holes are accelerated toward the zones of low potential, that is, toward the source 13 and substrate electrode 16, and hence toward the interface 20, when the gate voltage Vgs is negative. In this latter case the hole current that extends as far as the substrate electrode 16 is not sufficient to depolarize the junction of the substrate 11 with the source region 13a, and the result is a short channel transistor with negative resistance breakdown (snap-back breakdown).

In a transistor having a short gate 15a placed on a weakly doped substrate 11, the distribution of potential in the substrate causes a saddle point S to appear, located underneath the interface 20 at a depth included between 0.1 and 0.3 micrometers. This is described, for example, in the article entitled "Analytical Models of Threshold Voltage and Breakdown Voltage of Short Channel MOSFET's Derived from Two-Dimensional Analysis" by Toyabe et al, in the journal, IEEE Transactions on Electron Devices, 1979, ED-26, pages 453-461.

Figure 6:
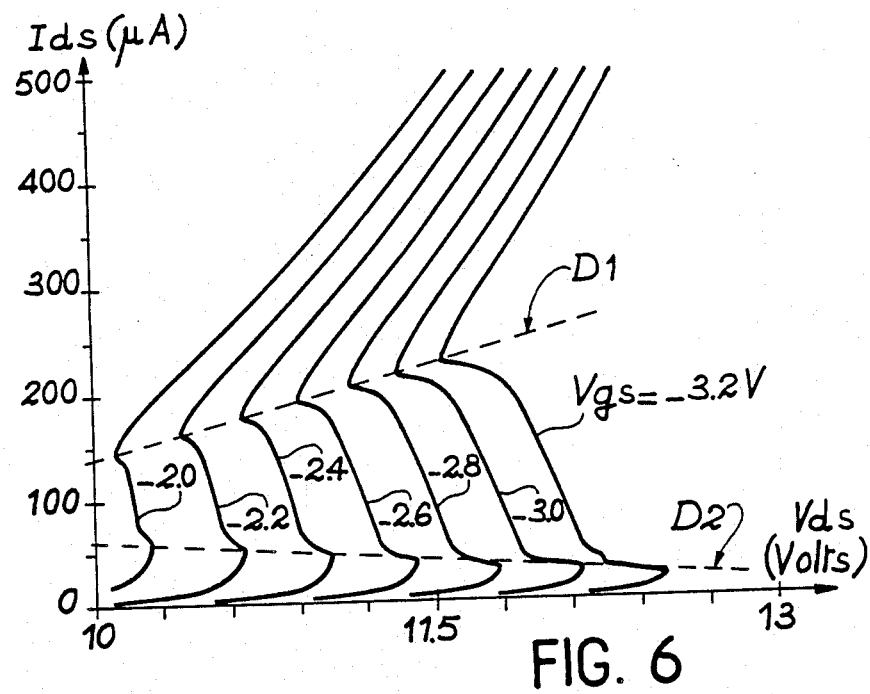
FIG. 6 is a graph showing the negative resistance corresponding to the hysteresis effect illustrated in FIGS. 4 and 5.

In saddle-pattern distribution, the point of minimum potential in a plan corresponds to a maximum potential in an orthogonal plane. The drain-source current Ids passes by way of this saddle point, under the above-described conditions. The holes that accumulate at the interface 20 during a short period of time modify the distribution of potential within the substrate 11 and consequently cause the value of the potential at the saddle point S to vary with respect to that of the interface 20. The holes accumulated at the interface 20 in turn escape toward the substrate electrode via the saddle point S and are replaced in equal quantity, in the steady state, with avalanche-created holes originating in the drain region 14a. The lowering of the potential barrier at the saddle point corresponds to the steady load at the level of the interface 20. However, at the changeover point upon outward scanning (startup point), the current that loads the interface 20 is always higher than the leakage current, so that a steady state can no longer prevail. This is followed by a lowering of the potential at the level of the saddle point, which increases the electron current between the drain and source. The increase of the electron current causes the creation by avalanche of a greater number of holes and thus gradually loads the interface 20. The result of this is positive feedback, which is equivalent to a negative resistance in the characteristic curves shown in FIGS. 4 and 5. FIG. 6 illustrates this fact with a graph representing the variations in the current Ids as a function of the drain voltage Vds for various values of the gate voltage Vgs when the transistor 12 is controlled with current. The portions of the curves included between the lines D1 and D2 express the existence of the negative resistance. This state continues until the current becomes high enough that the concentration of carriers balances the concentration of dopants. The transistor then enters the state of space-charge-limited current. In this state, the space charge itself limits any later modification of the distribution of potential.

In the return part of the cycle, the state remains limited by the space charge when the voltage decreases, until the drain-source current Ids attains a point at which the density of the movable carriers is equal to the density of the fixed carriers. Then the state in which the current is limited by the space charge can no longer be maintained. The transistor 12 drops back into a conventional state of subthreshold current.

The above explanation emphasizes the importance of the saddle point in creating the hysteresis effect disclosed by the invention. It has shown that the phenomenon of hysteresis is due to a particular doping of the substrate, which is not optimized with respect to the doping of conventional MOS transistors. More precisely, the doping must be sufficiently weak for there to be a saddle point S located just beneath the interface 20, but it must not be so weak that it can be masked by a space charge limited current state (this state being established at low current values). In the example shown, it has been seen that the doping lends the substrate the resistivity of 18 ohm.cm, which reveals that the substrate has not been strongly doped by comparison with the ordinary doping of conventional transistors. Moreover, the theory at present supposes that the hysteresis effect is produced only in short channel transistors. Also according to the theory, any implantation to counteract punchthrough (punchthrough implantation) would make it difficult for a hysteresis phenomenon to exist.

In summary, a hysteresis phenomenon is produced in subthreshold conduction of an MOS transistor the subtrate of which has been slightly doped so that a saddle point S is located just beneath the interface 20, without being too slight, to prevent masking by the space charge limited current that is established at low current values.

Figure 7:
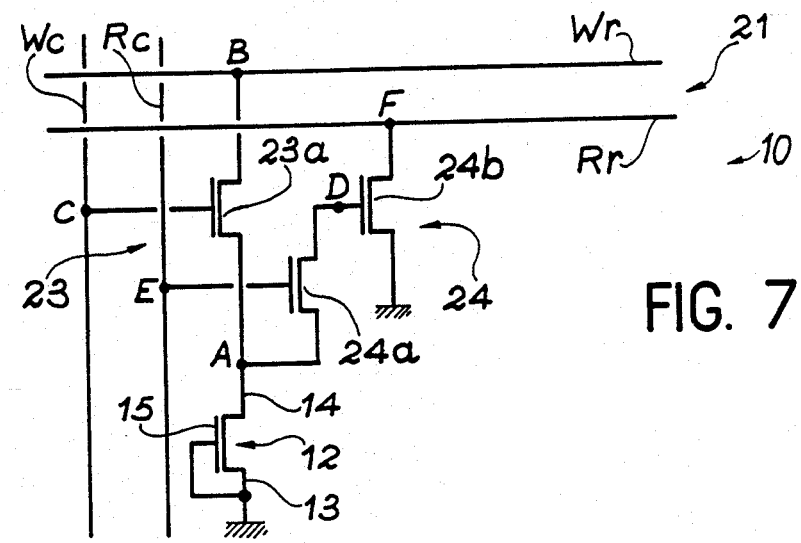
FIG. 7 schematically shows a cell structure of an integrated static RAM according to the invention.
Figure 8:
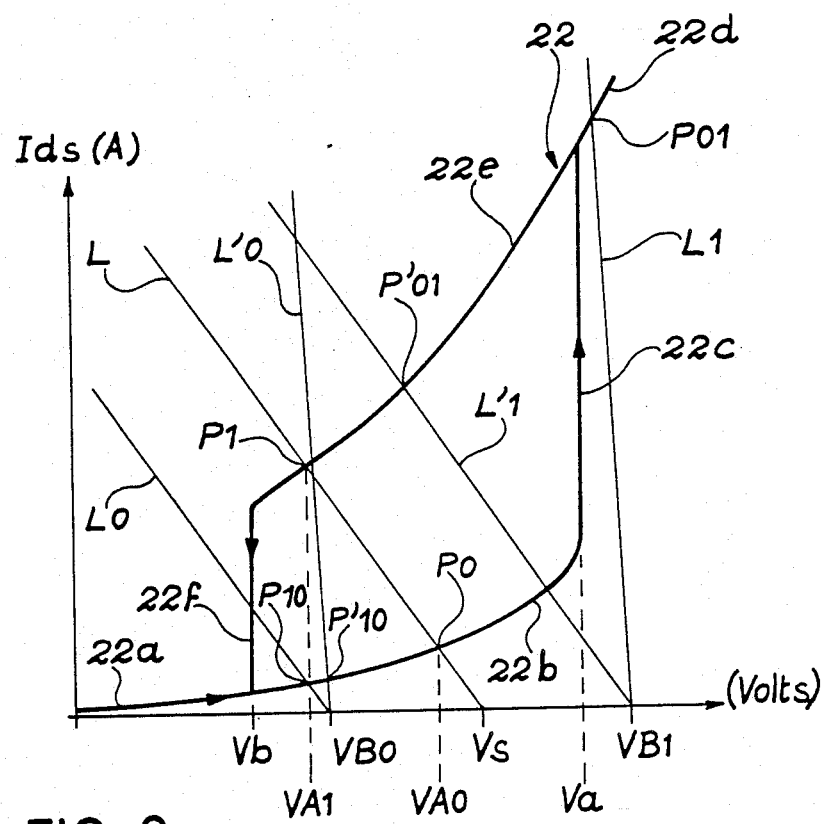
FIG. 8 is a graph illustrating the function of the memorizing transistor according to the invention contained in the cell shown in FIG. 7.

The hysteresis phenomenon is generally exploited to make an element having a memory of one data bit. The two stable states of the element, which are obtained in the course of one hysteresis cycle, respectively represent the two binary values of 0 and 1 of the data bit. Consequently, a transistor 12 according to the invention may advantageously, by itself, comprise a memory point in each cell of a memory integrated on a semiconductor package, such as the memory 10 shown in FIG. 1. Since the transistor can change from one state to the other as a function of its polarization, the memory 10 is a random access memory, or RAM. Like all conventional RAMs, the memory 10 according to the invention loses its information in the absence of supply voltage. On the other hand, the RAM 10 according to the invention is of the static type, since memorization is not effected by the acting of capacitors as in dynamic memories. In other words, in each cell of an integrated static memory, a single transistor 12 according to the invention and its load resistor can replace the conventional bistable multivibrator with two MOS transistors and two load resistors. FIG. 7 shows an exemplary embodiment of a memory cell 21 using the transistor 12 in the integrated static RAM 10 according to the invention. FIG. 8 illustrates the function of the cell 21 shown in FIG. 7.

In the cell 21 shown in FIG. 7, the transistor 12 is assumed to have the characteristic curve 22 plotted in bold lines in FIG. 8. The curve 22 shows the changeover for the outward course for the voltage Vds=Va, and the changeover for the return course for Vds=Vb. For the sake of convenience, the curve 22 has the following portions: 22a is the portion from 0 volts to Vb; 22b extends from Vb to Va; 22c is the curve front for the outward changeover; 22e corresponds to voltages Vds>Va; 22e is the return course included between Va and Vb; and 22f is the curve front for the return changeover. The memory cell 21 shown in FIG. 7 includes the transistor 12, a writing device 23 and a reading device 24. The transistor 12 has its gate electrode 15 and source electrode 13 connected to ground and has its drain electrode 14 connected to a point A. The writing device 23 shown also serves as a load resistor of the transistor 12. Thus the writing device 23 in the cell 21 is disposed between the point A, a line writing wire Wr and a column writing wire Wc. The writing device 23 includes a transistor 23a, of which the source is connected to the point A, the drain is connected via the wire Wr to the point B, and the gate is connected via the wire Wc to the point C. The reading device 24 of the cell 21 is assembled between the point A, a line reading wire Rr and a column reading wire Rc, and it includes two transistors 24a and 24b. The transistor 24a has its source connected to point A; its drain is connected to point D in common with the gate of the transistor 24b, and its gate is connected to the point E via the line Rc. The transistor 24b has its source connected to ground and its drain connected to the point F via the wire Rr. It is clear that the four wires Wr, Rr; Wc, Rc extend all along the integrated memory 10, to serve a plurality of cells positioned and connected to the same line and column, respectively, as the cell 21. Only a single cell is shown for clarity. It has already been pointed out that all the wires relating to the lines and columns are connected to a control logic, not shown.

The functioning of the cell 21 will now be described, referring to FIG. 8. The respective logic states of point A, B, . . . F will be called VA, VB, . . . VF. It will be noted that VA0 is the voltage at point A when VA=0; VA1 is the voltage at point A when VA=1; VB0 is the voltage at point B when VB=0; and so forth. In the initial state, the transistor 12 of each cell is polarized by the application of predetermined polarization voltages to points B and C of the transistor 23a in order to be placed in one of the states of repose corresponding to the logic states of 0 and 1. The transistor 23a comprises the load of the transistor 12 according to the invention. The load characteristic of the transistor 23a, under the functional conditions according to the invention of the transistor 12, is approximately a straight (linear) line L as shown in FIG. 8. Initially, let it be assumed that for a repose voltage VB=Vs, the straight line L is disposed in such a manner that the polarization point of the transistor 12 is placed at rest at the point P0 in the segment 22b of the characteristic curve 22 of this transistor. By convention, it is also assumed that this state of the transistors corresponds to the logic state 0, such that the voltage Vds of the transistor 12 is VA0, corresponding to VA=0. Similarly, for the logic state 0, VC=0. Advantageously, the transistor 23a is of the depletion type, such that the state VC=0 corresponds approximately to VC0=0 volts.

Now let it be assumed that the data bit "1" is to be written into the cell 21. This state corresponds to the other stable state of the transistor 12 and consequently necessitates triggering the startup of the hysteresis cycle of this transistor. As FIG. 8 shows, it is then necessary to raise the voltage Vds of the transistor 12. Consequently, excess voltages corresponding to the logic state of 1 are applied to points B and C, such that VB=1 and VC=1. The value VB1 of the voltage relating to VB=1 is necessarily higher than the startup voltage Va and thus shifts the straight load line L from Vs to VB1. On the other hand, the excess voltage corresponding to the change of logic state from the point C changes the slope of the straight load line L. The result is a straight load line L1, which at P01 intersects segment 22d of the characteristic curve 22 of the transistor 12. The polarization of the transistor has thus shifted from the point P0 on the segment 22b corresponding to the logic state 0 to the point P01 located after the startup of the hysteresis and corresponding to the logic state 1. From this transient state, a return is made to the state of repose corresponding to the straight load line L. If initially VB=1 and VC=0, the straight load line L1 becomes L'1, which matches the slope of the straight line L and causes the polarization point P01 to drop to the point P'01 on segment 22e of the characteristic curve 22 of the transistor 12. Since P'01 is located on this side of the descending curve front 22f of the hysteresis cycle, the state of the transistor once again corresponds to the logic state 1. The return to the state of repose VB=Vs and VC=0 shifts the straight load line L'1 to L, which intersects the segment 22e at P1, at which the transistors stabilizes in the logic state 1 (VA=1).

If it is now desired to rewrite a data bit "0" in the cell 21, then as shown in FIG. 8 the polarization of the transistor 12 must cross over the descending curve front 22f of the hysteresis cycle 22. This makes it necessary to lower the voltage VA. To do so, VC is set=0 and consequently the voltage VB is lowered to a value VB0 corresponding to the logic state 0 (VB=0), The result is a shift of the straight load line L to a position L0 at which the polarization of the transistor 12 crosses over the return curve front segment 22f of the hysteresis cycle 22. The polarization of the transistor now becomes established at a stable intermediate state P10. The point P10 is located here on the segment 22b at which the logic state of the transistor is 0. It will be noted that if the state of point C becomes VC=1, the straight line L0 rotates about the point VB0 until it is located in a position L'0 that is parallel to the line L1. The polarization point P10 shifts on the segment 22b and becomes fixed at P'10, always corresponding to the logic state 0 of the tranbsistor 12. The return to the state of repose (VB=Va and VC=0) corresponds to the straight load line L, which places the polarization of the transistor 12 at the point P0 relating to the logic state 0 (VA=0). In summary, the writing of a data bit in the transistor 12 of the cell 21 is done for the states VB=1, VC=1 and VB=0, VC=0. On the other hand, it has been seen that the other states VB=0, VC=1 and VB=1, VC=0 do not change the state of the transistor 12. In other words, besides the function of writing, the transistor 23c can serve the purpose of addressing the cell 21.

Reading of the data bit contained in the transistor 12 of the cell 21 is done via the wires Rc and Rr and the transistors 24a and 24b. The points involved are A, D, E, F.

If VA=1, the conduction of the transistor 24a makes for VD1=VA1−V't, where V't is the threshold voltage of the transistor 24a. By adjusting the threshold for triggering the conduction of the transistor 24a to a voltage greater than VD1, this transistor remains blocked and maintains the state VF=1.

Contrarily, if VA=0, the transistor 24a conducts, and so VD0=VA0−V't. By adjusting the threshold for triggering the transistor 24b to a voltage less than VD0, this transistor is then changing and causes the logic state of the line Rr to change from 1 to 0. In summary, by putting a logical "1" on the Rr and Rc wires, the absence of a transition indicates the presence of a logical 1 in the transistor 12 (VA=1), while a transition indicates that the transistor 12 is at the logic state of 0 (VA=0).

Preferably, the triggering threshold of the transistor 24b has the mean value of VD1 and VD0. On the other hand, it should be noted that the use of the transistor 24b is optional. It is advantageous to incorporate it, to accelerate the discharge of the line Rr. In effect, it is seen that the conduction of the transistor 24b directly discharges the line Rr. Otherwise, in the absence of the transistor 24b (D=F), the discharge of the line Rr would have to be done via the transistor 24a and the transistor 12. Given the high capacitance of the line Rr and the low intensities of the discharge current in the transistor 12, the discharge time would be markedly longer.

What is claimed is:

1. A metal-oxide-semiconductor field effect transistor (MOSFET) (12) comprising a semiconductor substrate (11), a source region (13a) and a drain region (14a) incorporated in said semiconductor substrate, said source region and said drain region being respectively connected to source and drain potentials (Vs, Vd) and delimiting a doped channel (19) therebetween, and a gate 15a) overlying said channel (19) through a gate oxide layer (18) and being connected to a gate potential (Vg), said transistor having a subthreshold conduction condition in which a drain-source current (IDs) shows a hysteresis cycle when one of said drain potential or gate potential is varied up and down.

2. A transistor as defined in claim 1, wherein the doped channel (19) has a predetermined low concentration of dopants sufficient to make the hysteresis cycle in the drain-source current (Ids) distinguishable from current limited by space charge in the channel.

3. A transistor as defined in claim 1, wherein said transistor comprises a short-channel type MOSFET, and said gate (15a) has a length, measured in a direction of said drain-source current, which is less than approximately 5 micrometers.

4. An integrated metal-oxide-semiconductor (MOS)-type static random access memory (RAM) (10) including a semiconductor substrate (11) and at least one memory cell (21) comprising a memory metal-oxide-semiconductor field effect transistor (MOSFET) (12) having, in said semiconductor substrate, a source region (13a) and a drain region (14a) respectively connected to source and drain potentials (Vs, Vd) and delimiting a doped channel (19) therebetween, and, over said semiconductor substrate, a gate (15a) operatively overlying said channel through a gate oxide layer (18) and being connected to a gate potential (Vg), said memory MOSFET having a subthreshold conduction condition in which a drain-source current (Ids) shows a hysteresis cycle when one of said drain potential or gate potential is varied up and down; and means for writing (23) and means for reading (24) data in said memory MOSFET.

5. An integrated MOS-type static random access memory as defined in claim 4, wherein said channel has a predetermined low concentration of dopants sufficient to make the hysteresis cycle in the drain-source current (Ids) distinguishable from current limited by a space charge in the channel.

6. An integrated MOS-type static random access memory as defined in claim 4, wherein the memory MOSFET is of the short-channel type.

7. An integrated MOS-type static random access memory as defined in claim 4, wherein said writing means (23) comprises a first MOSFET (23a) having a drain-source path serially connected with said memory MOSFET (12) to a first writing wire (Wr) and having a gate electrode connected to a second writing wire (Wc).

8. An integrated MOS-type static random access memory as defined in claim 7, wherein said first MOSFET is of a depletion type.

9. An integrated MOS-type static random access memory as defined in claim 7, wherein said cell further comprises addressing means, said addressing means including said first MOSFET.

10. An integrated MOS-type static random access memory as defined in claim 4, wherein said reading means (24) comprises a second MOSFET (24a) having a drain-source path serially connected with said memory MOSFET to a first reading wire (Rr) and having a gate electrode connected to a second reading wire (Rc).

11. An integrated MOS-type static random access memory as defined in claim 10, wherein said first reading wire (Rr) has a high capacitance, and said cell further comprises means (24b) for discharging said capacitance.

12. An integrated MOS-type static random access memory as defined in claim 11, wherein said discharging means comprises a third MOSFET (24b) having a drain-gate serially connected with the drain-source path of said second MOSFET (24a) to said reading wire (Rr).

13. A short-channel type metal-oxide-semiconductor field effect transistor (12) comprising a semiconductor substrate (11), a source region (13a) and a drain region (14a) incorporated in said semiconductor substrate and respectively connected to source and drain poatentials (Vs, Vd) and delimiting a channel (19) therebetween having a predetermined low concentration of dopants, and a gate (15a) overlying said channel (19) and a gate oxide layer (18), the gate being connected to a gate potential (Vg), said transistor having a subthreshold conduction condition in which drain-source current (Ids) shows a hysteresis cycle when one of said drain potential or gate potential is varied up and down.

* * * * *

UNITED STATES PATENT AND TRADEMARK OFFICE
CERTIFICATE OF CORRECTION

PATENT NO. : 4,843,442

DATED : June 27, 1989

INVENTOR(S) : BOUDOU et al

It is certified that error appears in the above-identified patent and that said Letters Patent is hereby corrected as shown below:

On the title page:

In the Title, - delete the second occurence of "And".

Col. 10, claim 1, line 16, 15a)" should be -- (15a) --.

Col. 10, claim 1, line 19, "(IDs)" should be --(Ids)--.

Signed and Sealed this

Fourteenth Day of August, 1990

*Attest:*

HARRY F. MANBECK, JR.

*Attesting Officer*     Commissioner of Patents and Trademarks